(12) United States Patent
Motohashi et al.

(10) Patent No.: US 7,355,413 B2
(45) Date of Patent: Apr. 8, 2008

(54) TESTING METHOD/ARRANGEMENT MEASURING ELECTROMAGNETIC INTERFERENCE OF NOISE IN A TO-BE-TESTED PRINTED CIRCUIT BOARD

(75) Inventors: Kenji Motohashi, Kanagawa (JP); Hideji Miyanishi, Kanagawa (JP); Kazumasa Aoki, Tokyo (JP); Toshinobu Shoji, Kanagawa (JP); Kikuo Kazama, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 11/342,541

(22) Filed: Jan. 31, 2006

(65) Prior Publication Data

US 2006/0181287 A1   Aug. 17, 2006

(30) Foreign Application Priority Data

Jan. 31, 2005   (JP)   ............................. 2005-022866

(51) Int. Cl.
*G01R 29/26* (2006.01)
*G01R 27/28* (2006.01)
(52) U.S. Cl. ...................................... 324/613; 324/628
(58) Field of Classification Search ................ 324/613, 324/628

See application file for complete search history.

(56) References Cited

U.S. PATENT DOCUMENTS

| 6,201,403 | B1 * | 3/2001 | Rollin et al. ................. 324/765 |
| 6,782,347 | B2 * | 8/2004 | Hirano et al. ................ 702/183 |
| 7,098,670 | B2 * | 8/2006 | Cole ........................... 324/615 |
| 7,126,356 | B2 * | 10/2006 | Maloney ...................... 324/750 |

FOREIGN PATENT DOCUMENTS

| JP | 57-28381 | 2/1982 |
| JP | 5-315938 | 11/1993 |
| JP | 2000-304782 | 11/2000 |
| JP | 2001-41987 | 2/2001 |
| JP | 3263672 | 12/2001 |
| JP | 2002-149720 | 5/2002 |
| JP | 2002-318253 | 10/2002 |
| JP | 2003-279612 | 10/2003 |
| JP | 2004-347379 | 12/2004 |

* cited by examiner

*Primary Examiner*—Andrew H. Hirshfeld
*Assistant Examiner*—Amy He
(74) *Attorney, Agent, or Firm*—Oblon, Spivak, McClelland, Maier & Neustadt, P.C.

(57) ABSTRACT

A testing method for measuring electromagnetic interference of a noise on a to-be-tested printed circuit board, has the steps of: a) injecting a signal simulating an expected noise of a predetermined device mounted on the to-be-tested printed circuit board, into the to-be-tested printed circuit board, in a condition in which at least the predetermined device is not actually mounted on the to-be-tested printed circuit board; and b) measuring electromagnetic interference of the signal.

10 Claims, 12 Drawing Sheets

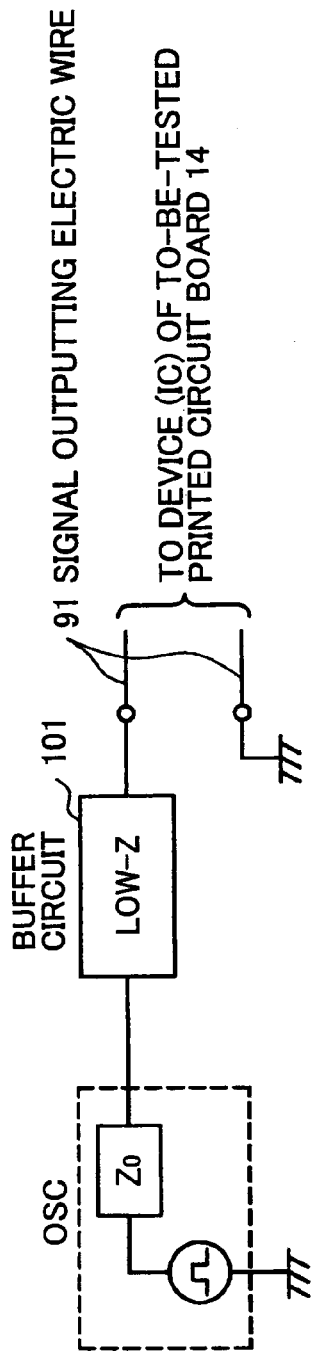
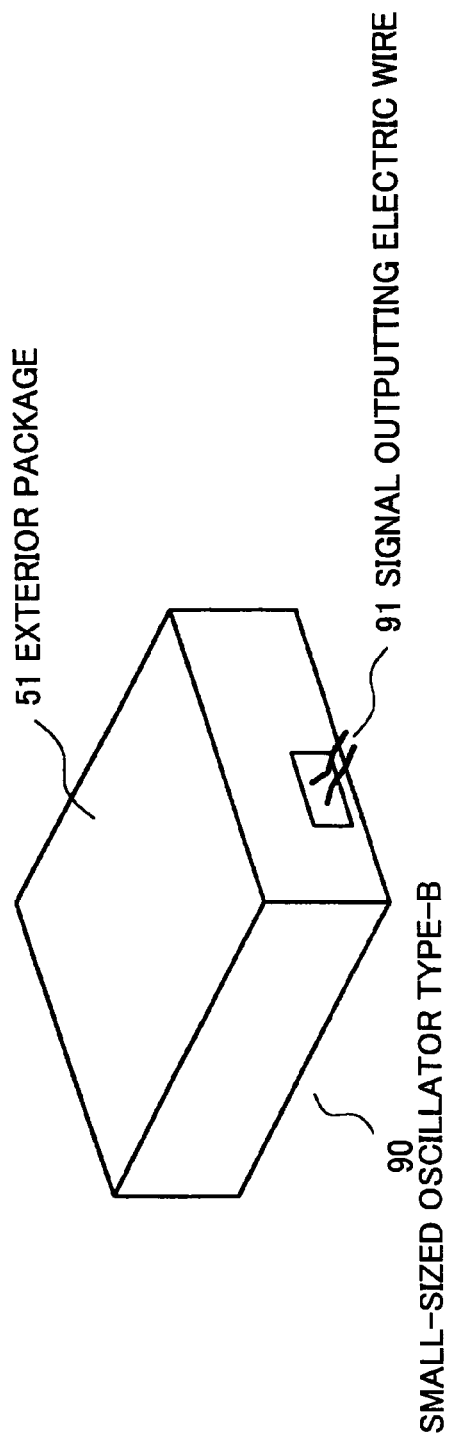

TESTING METHOD/ARRANGEMENT MEASURING ELECTROMAGNETIC INTERFERENCE OF NOISE IN A TO-BE-TESTED PRINTED CIRCUIT BOARD

BACKGROUND OF THE INVENTION

1. Field of the Invention

The present invention relates to a testing method and a testing system for testing a printed circuit board in a noise analysis manner by injecting a signal simulating noise thereinto.

2. Description of the Related Art

A required operation speed in an electronic apparatus increases for handling a large amount of information, and, along therewith, EMI noise (electromagnetic interference noise) emitted by the electronic apparatus increases, for which appropriate countermeasure is required. Since EMI noise may cause malfunction of a neighbor electronic apparatus, restriction is applied by means of a rule/law worldwide. Unless the restriction is satisfied, import to or sales in the relevant country are not allowed. Accordingly, when an electronic apparatus which is to be sold in a country does not satisfy the restriction of the country, the sales should be stopped or canceled, whereby a significant loss may occur in a manufacture. Notwithstanding, EMI noise countermeasure may have not necessarily been strictly taken in a series of procedure concerning development of electronic apparatuses.

Along with increase in an operation speed, complicatedness, and a circuit density in an electronic circuit, the number of places generating noise increases, and thus, determination thereof may become difficult. Especially, noise generated by an electronic circuit due to increase in its operation speed may become a serious problem.

However, actually, since many possible noise sources exist in a printed circuit board, determination of a target noise generating source therefrom may be very difficult.

When only a single noise generating source is present, whether or not a serious problem occurs, or a cause of the problem if any, may be easily determined from a noise distribution obtained by a noise visualization measurement apparatus or such.

Japanese Patent No. 3263672 discloses a noise injector and a noise injecting method for example. In this method, noise (in a common mode or a normal mode) is added to commercial power supply in a condition in which power is turned on in a to-be-measured apparatus, and respective noises (in a common mode or a normal mode) are injected to a power supply line and a ground line of the to-be-measured apparatus. However, in this method, since the noise is injected to the power supply line of the to-be-measured apparatus, a target noise source may not be properly determined.

Further, since various frequency bands of noises may be generated from a device (IC), impedance of a part into which noise is injected should be considered upon noise injection depending on a frequency band of the noise to inject.

Further, this method relates to injection of signal simulating external noise.

Thus, the purpose is different from a purpose of present invention that an influence of EMI noise generated by a device included in a printed circuit board is measured.

Further, in this method, a device operation is necessary to measure. However a purpose of the present invention is to measure how a noise signal spreads from a power supply terminal or such, and thus, to measure an influence on a substrate itself. Accordingly, the to-be-tested substrate should not necessarily operate properly for the testing purpose.

Further, Japanese Laid-open Patent Application No. 2002-318253 for example discloses a noise visualization system and a display method therefore. In this art, a high frequency signal simulating noise is injected to a to-be-tested apparatus via a wire harness from an injection probe. However, in this document, how to treat standing waves generated in a cable is not addressed. In this method, radiation from the cable may be included in a measurement result of the noise visualization apparatus and thus, a measurement result only from the to-be-tested substrate may not be accurately obtained.

As a result, the measurement result may vary depending on an actual positional relationship between the cable and the to-be-tested substrate. In order to solve this problem, a measurement method is required in which radiation from a cable is prevented from interfering the to-be-tested printed circuit board.

SUMMARY OF THE INVENTION

As mentioned above, many noise generating sources may exist on a printed circuit board, and, determination of a noise generation source for a target frequency therefrom may be very difficult. Further, when noise is injected into a power supply line of the to-be-tested apparatus, a relevant target noise source can not be determined.

An object of the present invention is to provide a testing method/arrangement in which a printed circuit board noise injecting arrangement is provided by which a signal (noise) of any frequency can be injected for the test purpose, instead of generating from an actual device itself, into a power supply terminal and a ground terminal for the target device on the printed circuit board, efficiently.

According to the present invention, for measuring an influence of noise on a to-be-tested printed circuit board, a signal simulating an expected noise from a predetermined target device on the to-be-tested printed circuit board is injected into the to-be-tested printed circuit board, in a condition in which at least the predetermined device is not actually mounted on the to-be-tested printed circuit board; and an electromagnetic influence of the signal on the to-be-tested printed circuit on the to-be-tested printed circuit board is measured.

In this method, since a test is carried out in a condition in which the corresponding target device is not mounted, an accurate test result can be obtained since an influence of the corresponding target device itself can be positively eliminated.

BRIEF DESCRIPTION OF THE DRAWINGS

Other objects and further features of the present invention will become more apparent from the following detailed description when read in conjunction with the accompanying drawings:

FIG. 11 generally shows a configuration of a low-output-impedance buffer circuit according to a fifth embodiment of the present invention;

FIG. 12 shows an external perspective view of a small-sized oscillator Type-B;

DETAILED DESCRIPTION OF THE PREFERRED EMBODIMENTS

Figure 1:
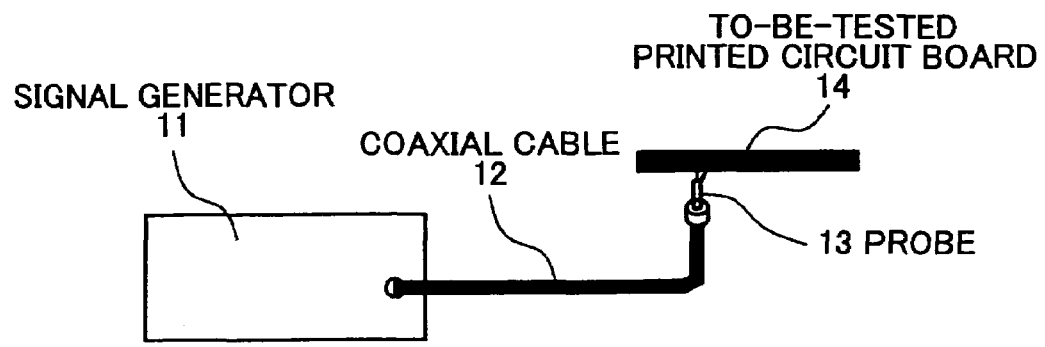
FIG. 1 generally shows a noise injecting method for a to-be-tested printed circuit board with a signal generator, a coaxial cable and a probe, according to a first embodiment of the present invention.

According to the present invention, for measuring an influence of noise on a to-be-tested printed circuit board, a signal simulating expected noise of a predetermined target device mounted on the to-be-tested printed circuit board is injected into the to-be-tested printed circuit board, in a condition in which at least the predetermined target device is not actually mounted on the to-be-tested printed circuit board (step a)); and electromagnetic interference of the signal is measured (step b)).

According to the present invention, in the step a), the signal simulating the expected noise may be injected into the to-be-tested printed circuit board from a power supply line and a ground line for the predetermined device.

Further, the steps a) and b) may be carried out for each of the target devices mounted on the to-be-tested printed circuit board, which devices are expected to act as noise sources.

In the step a), a noise injecting arrangement may be applied to inject the signal simulating the expected noise to the to-be-tested printed circuit board, and the noise injecting arrangement includes:

a signal generator as a noise generating source;

a coaxial cable connected to an output of the signal generator; and a probe, connected to the other end of the coaxial cable, and transmitting a noise-simulating signal transmitted through the coaxial cable to a power supply terminal and a ground terminal of the to-be-tested printed circuit board for the predetermined target device.

As the probe, a semi-rigid cable with an SMA connector mounted thereto may the applied.

In the step a), a noise injecting arrangement may be applied to inject the signal simulating the expected noise to the to-be-tested printed circuit board, and the noise injecting arrangement includes:

a signal generator as a noise generating source;

a coaxial cable connected to an output of the signal generator; and an impedance matching device, connected to the other end of the coaxial cable, and transmitting a noise simulating transmitted through the coaxial cable to a power supply line and a ground line of the to-be-tested printed circuit board for the predetermined target device.

The impedance matching device may include:

an SMA connector connecting between the coaxial cable and the impedance matching device;

a copper plate for mounting components thereon;

a ground connecting copper plate for connecting between the impedance matching device and a ground line of the to-be-tested printed circuit board;

an electric wire connecting between the impedance matching device and a power supply line of the to-be-tested printed circuit board; and a matching circuit for matching impedance between the signal generator and the to-be-tested printed circuit board.

In the matching circuit, a signal terminal of the signal generator may be connected to one end of a first capacitor;

the other end of the first capacitor may be connected to one end of a second capacitor and a resistor;

the other end of the resistor may be connected to one end of a first inductor and one end of a second inductor; and the other end of the second capacitor and the other end of the second inductor may be connected to a ground line of the signal generator.

In the step a), a noise injecting arrangement may be applied to inject the signal simulating the expected noise to the to-be-tested printed circuit board, and the noise injecting arrangement includes:

supporting columns supporting the to-be-tested printed circuit board; and a probe supporting table supporting an SMA connector of a probe in such a manner that the SMA connector may stand perpendicularly to a to-be-measured side of the to-be-tested printed circuit board, wherein:

the supporting column and the probe supporting table are provided for the purpose of fixing positional relationship between a cable for injecting the noise-simulating signal to the to-be-tested printed circuit board and the to-be-tested printed circuit board, in consideration of an influence of radiation from the cable.

In the step a), a noise injecting arrangement may be applied to inject the signal simulating the expected noise to the to-be-tested printed circuit board, wherein:

in the noise injecting arrangement, a sinusoidal wave signal may be obtained as an output signal of a small-sized oscillator via a BPF; and the small-sized oscillator may include:

an oscillating circuit outputting a signal of a predetermined frequency;

a coil removing a harmonic component of the signal;

a printed circuit board for mounting the components; and a battery for driving the respective components.

In the small-sized oscillator, as the BPF, a first turning circuit including a first inductor and a first capacitor for receiving a rectangular-wave signal generated from the oscillating circuit for removing harmonic components from the rectangular-wave signal;

a second capacitor for coupling; and a second turning circuit comprising a second inductor and a third capacitor for controlling a frequency band and an attenuation amount of the signal, for outputting a signal only having a predetermined frequency, to a probe connecting the SMA connector, may be applied.

In the step a), a noise injecting arrangement may be applied to inject the signal simulating the expected noise to the to-be-tested printed circuit board, wherein:

in the noise injecting arrangement, for the purpose of invalidating standing waves of a coaxial cable, the to-be-tested printed circuit board may be fixed on a predetermined fixing jig; and a small-sized oscillator may be disposed on a pedestal right below the to-be-tested printed circuit board.

The pedestal may be omitted when the small-sized oscillator is so small that the table is not required; and then, the small-sized oscillator may be directly mounted on the to-be-tested printed circuit board.

In the step a), a noise injecting arrangement may be applied to inject the signal simulating the expected noise to the to-be-tested printed circuit board, wherein:

in the noise injecting arrangement, for the purpose of invalidating standing waves of a coaxial cable, a small-size cable may include:

an oscillating circuit outputting a signal of a predetermined frequency;

a buffer circuit comprising inverters connected in parallel;

a printed circuit board for mounting the component; and a battery driving the respective components.

The to-be-tested printed circuit board may be fixed on a predetermined fixing jig; and the small-sized oscillator may be disposed on a pedestal right below the to-be-tested printed circuit board.

The pedestal may be omitted when the small-sized oscillator is so small that the table is not required; and then, the small-sized oscillator may be mounted on the to-be-tested printed circuit board, wherein:

the small-sized oscillator may be directly soldered to a power supply terminal and a ground terminal of the to-be-tested printed circuit board, the power supply terminal and the ground terminal are those for the predetermined device.

According to the present invention, a noise visualization measurement apparatus is applied, and, without actually turning on power in a to-be-tested printed circuit board, noise of a predetermined frequency of a predetermined target noise generating source is injected into the to-be-tested printed circuit board from terminals provided there for the corresponding device (possible noise generating source). As a result, a flow of a radio frequency electric current (magnetic field) flowing through a power source line, a ground line or such of the to-be-tested printed circuit board injected from the above-mentioned terminals provided for the target device corresponding to the noise generating source can be obtained visually. Accordingly, whether or not a problem may actually occur can be visually determined (in a first embodiment of the present invention).

It is noted that the particular device corresponding to the target noise generating source, which is originally a device (IC or such) mounted on the to-be-tested printed circuit board in an actual product, may be removed for the test purpose as will be described later. Alternatively, a printed circuit board, corresponding to the actual printed circuit board, is produced merely for the test purpose, on which at least the target device is not mounted, or all the devices, which are expected to act as noise generating sources, may not be mounted.

Further, in a second embodiment of the present invention, an impedance matching device is inserted. Thereby, a noise-simulating signal can be efficiently transmitted to the power supply terminal and the ground terminal for the target device (IC) mounted on the to-be-tested printed circuit board for a desired frequency.

Further, in a third embodiment of the present invention, as a result of a special fixing jig being applied, a measurement result can be prevented from varying otherwise varying depending on a positional relationship between a coaxial cable and the to-be-tested printed circuit board when measurement is carried out with the use of a noise visualization measurement apparatus. Simultaneously, variation in the measurement result for every measurement operations can be minimized.

In a fourth embodiment of the present invention, with the use of a small-sized oscillator Type-A, a measurement result for the to-be-tested printed circuit board alone can be obtained when a noise-simulating signal is injected to the power supply and ground terminals of the to-be-tested printed circuit substrate provided for the target device, without consideration of radiation from the coaxial cable. Also, when a noise-simulating signal is injected in a manner disclosed by Japanese Laid-open Patent Application No. 2002-318253 in which a coaxial cable and an injection probe are electromagnetically coupled, consideration for radiation from the cable included in a measurement result of a visualization measurement apparatus is not required.

In a fifth embodiment of the present invention, with the use of a small-sized oscillator Type-B, consideration for radiation from the coaxial cable is not required, and also, since impedance approximating the output impedance of the target device (IC) can be obtained, a measurement result of the to-be-tested printed circuit board alone can be obtained when a noise-simulating signal is injected into the power supply and ground terminals for the target device in a behavior condition approximating an actual condition of behavior.

Further, as a result of a noise injecting method according to the present invention being applied, a device which may actually act as a problematic noise source and a corresponding frequency can be determined from a measurement result of a noise visualization measurement apparatus. As a result, root cause analysis can be carried out easily, and thus, a working process required for noise countermeasure can be effectively reduced. Further, according to the present invention, a device for reducing radiation from a cable, a device for avoiding electromagnetic interference, a device for avoiding variation in a measurement result, and so forth, are provided with the use of a special fixing jig. Accordingly, accuracy in the measurement result of the noise visualization measurement apparatus for the to-be-tested printed circuit board can be improved.

Each embodiment will now be described in details with reference to figures.

Figure 16:
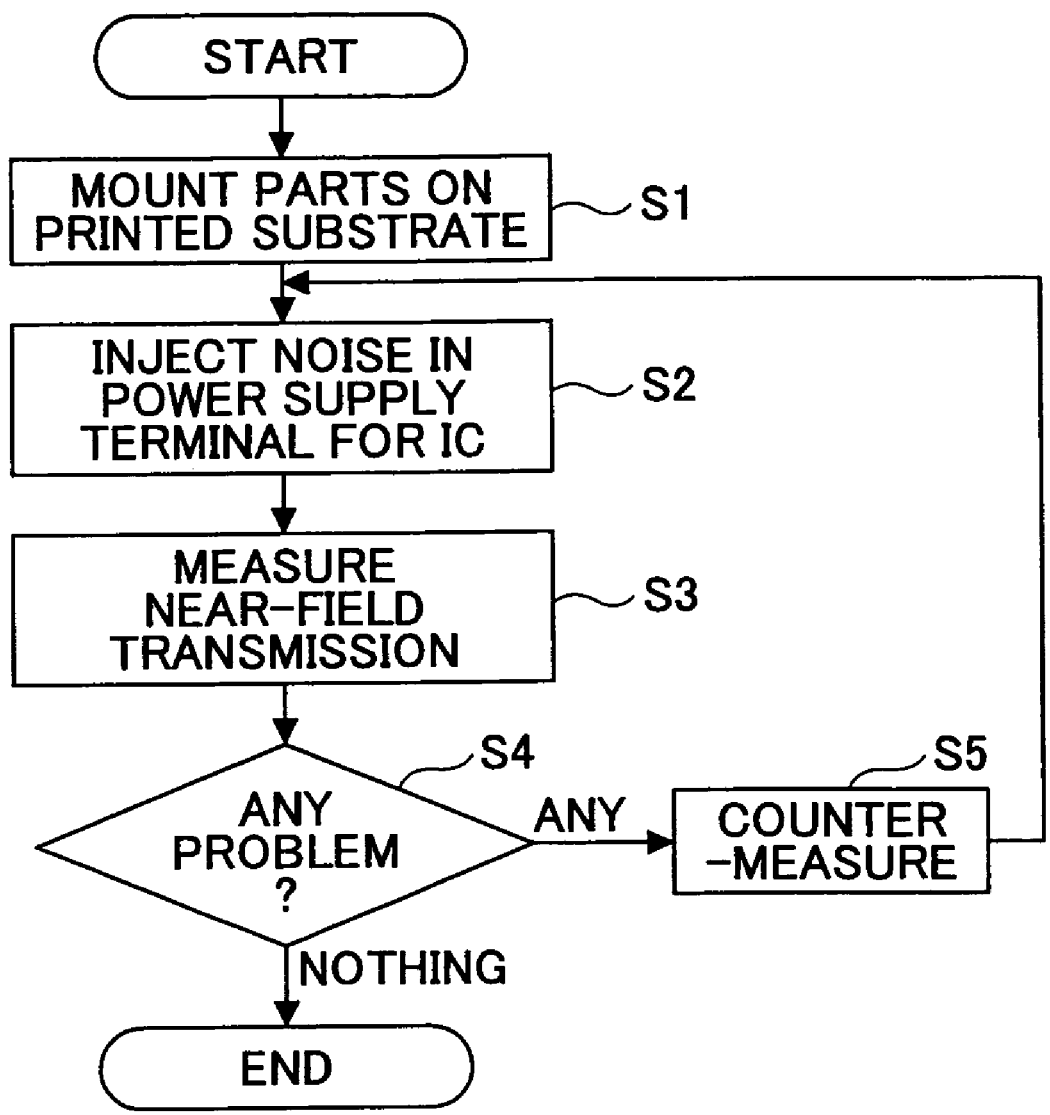
FIG. 16 shows a flow chart of a testing method according to one embodiment of the present invention.

FIG. 16 shows a flow chart of one embodiment of an overall testing method for testing a to-be-tested printed circuit board according to the present invention.

First, as a typical example, only passive components such as resistors, inductors, capacitors or such, are mounted on a printed substrate 14 between a power supply line and a ground line, on which, first, no components have been mounted yet. Then, arbitrary power supply and ground patterns provided on the printed substrate 14 for a certain target device (IC) are connected with terminals of a signal generator 11 for a signal simulating noise and ground connection (see FIG. 17). Then, the signal generator 11 is turned on. Thereby, a situation in which noise occurs between a power supply terminal and a ground terminal of the certain target device (IC) mounted on the to-be-tested printed circuit board 14 is simulated without actually mounting the device and thus, without actually operating the corresponding device. In order to measure near-field transmission occurring from the noise occurring between the power soppy and ground terminals of the certain target device (IC) on the to-be-tested printed circuit board 14, a noise visualization measurement apparatus 200 (or a near-field transmission measurement apparatus, see FIG. 17) is applied, whereby the noise can be visualized. Such an arrangement is shown in FIG. 17, for example.

Figure 17:
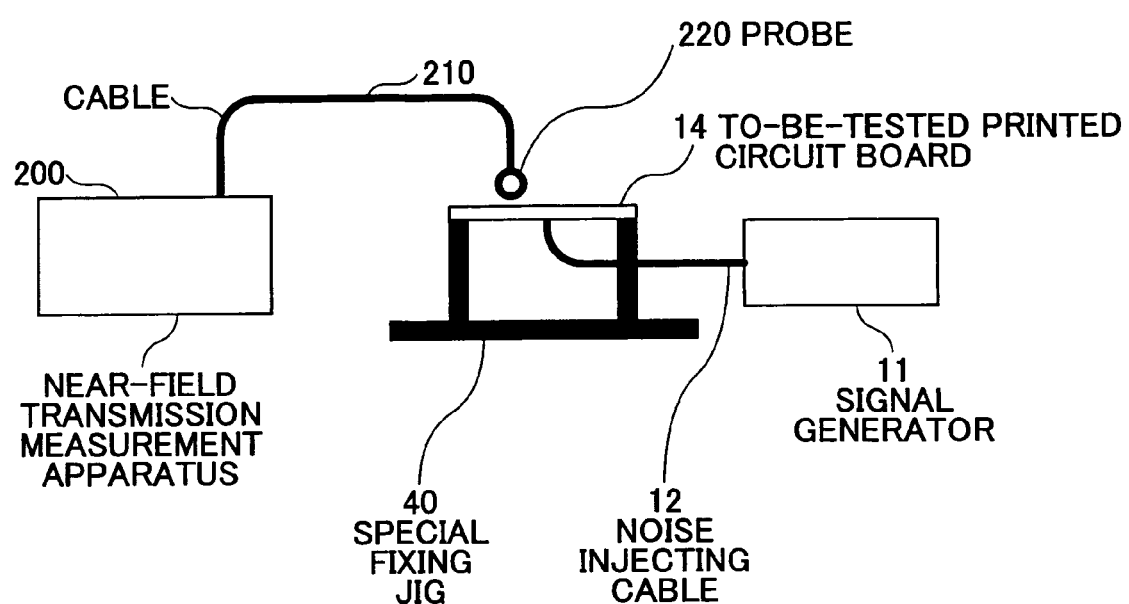
FIG. 17 shows an arrangement of the testing method described with reference to FIG. 16.

As shown in FIG. 17, a testing arrangement according to the embodiment of the present invention includes a noise visualization measurement apparatus 200 for measuring near-field transmission on the printed substrate (i.e., the to-be-tested printed circuit board) 14 and controlling probe scanning; the probe 220 for caching near-field transmission on the printed substrate 14; and a cable 210 transmitting the thus-caught near-field transmission to the noise visualization measurement apparatus 200. On the other hand, a noise injecting arrangement of FIG. 17 includes the above-mentioned signal generator 11 for injecting a signal simulating noise to the power supply and ground lines for the target device (IC) on the to-be-tested printed circuit board 14 (on which only the passive components are mounted between the power supply line and the ground line as mentioned above, as the typical example) via the cable 12; and a special fixing jig 40 for fixing the cable 12 and the to-be-tested printed circuit board 14.

By disposing the probe 220 on the printed substrate 14 in which the noise-simulating signal is injected by means of the noise injecting arrangement, and scanning on the printed substrate 14 with the probe 220, near-field transmission on the printed substrate 14 is measured. For example, when an area at which a magnetic field is especially high exists from a profile of the magnetic field on the printed substrate 14 obtained as the measurement result, no special countermeasure is required. However, when a large spread of a magnetic field is found on the printed substrate 14, a countermeasure, i.e., inserting a capacitor on the printed substrate 14, or such, may be required. In this case, a noise-simulating signal is again injected in the printed substrate on which the countermeasure has been thus taken, for the target device (IC), the probe 220 for caching near-field transmission is disposed on the printed substrate 14 at which the noise situation signal is thus injected. Then, the probe 220 is applied to scan the printed substrate 14. Thus, near-field transmission on the printed substrate is measured, and thus, effect of the countermeasure can be verified. When the effect of the countermeasure has been verified, the test is finished.

As shown in FIG. 17, the to-be-tested printed circuit board 14 is prepared on which the components have been mounted, in Step S1 of FIG. 16. However, when a noise-simulating signal is injected in a condition in which a target device (noise presumably generated from this device is simulated as a result of the noise-simulating signal being injected into the power supply and ground terminals on the printed substrate provided for this device) is actually mounted on the to-be-tested printed circuit board 14, the device itself may absorb the thus-injected noise-simulating signal. As a result, a generating magnetic field may decrease, and thus, a satisfactory measurement result may not be obtained. In such a case, the target device is not mounted, and the other devices are mounted on the printed substrate. Thereby, sufficient measurement magnetic field intensity can be obtained. Further, when a series of measurement steps are carried out successively for a plurality of target devices on the to-be-tested printed circuit board 14 for each of which generating noise is simulated as mentioned above, some or all of the target devises are not mounted on the printed substrate, and the other components are mounted. Or, as mentioned above, only the passives components are mounted on the printed substrate, for the testing purpose. Thereby, the number of printed substrates to prepare for the testing purpose can be effectively reduced.

In Step S2 of FIG. 16, the noise-simulating signal is injected into the power supply line (power supply pin) of the target device. However, for the case where the target device itself is not mounted actually as a mentioned above, the noise-simulating signal is injected in this case into the power supply line (power supply land or pad) provided for the target device on the printed substrate 14.

In Step S3, the probe 220 for catching near-field transmission is disposed on the printed substrate 14 in which the noise-simulating signal is thus injected, and the probe 220 is applied to scan the printed substrate 14. Thus, near-field transmission on the printed substrate 14 is measured. By thus applying the probe 220 to scan the printed substrate 14, a magnetic field intensity profile on the printed substrate 14 can be obtained. When the entirety of the magnetic field is sufficiently large, the magnetic field may be measured in a condition in which the probe 220 is set at a location apart from the printed substrate 14 by a predetermined distance.

In Step S4, the thus-obtained magnetic field intensity profile is compared with a reference or standard one. Then, when any problem is found therefrom (Yes in Step S4), an appropriate countermeasure is taken in Step S5, as mentioned above, and after that, measurement is carried out again in Steps S2 and S3.

Also in the respective embodiments described below, the basic arrangement of the above-mentioned procedure is applied in common.

The above-mentioned first embodiment of the present invention is described below.

In the first embodiment, a noise-simulating signal is injected to a power supply line and a ground line of a to-be-tested printed circuit board 14, and thereby, a problematic place in terms of EMI is determined. For this purpose, a noise injecting method is applied in which a noise-simulating signal having a desired frequency is injected for a corresponding presumable noise generating source mounted on the to-be-tested printed circuit board, with the use of an external signal source and a cable.

FIG. 1 shows a noise injecting arrangement for injecting a noise-simulating signal to a to-be-tested printed circuit board 14 according to the first embodiment of the present invention.

For simulating a target device on a to-be-tested printed circuit board 14, a commercially available signal generator 11 is applied. Further, a coaxial cable 12 for transmitting the signal, and a probe 13 for transmitting the signal transmitted through the coaxial cable 12 to a power supply line and a ground line of the to-be-tested printed circuit board 14 provided for the target device, are provided.

As the signal generator 11, one having a function of outputting a clock pulse wave form of a desired frequency is applied. For this purpose, a signal generator outputting sinusoidal waves may be applied.

As the probe 13 for transmitting the noise-simulating signal to the power supply and ground lines for the target device on the to-be-tested printed circuit board 14, one having an SMA connector for connecting with the coaxial cable 12, and also, having a shape such that soldering to the power supply and ground terminals on the to-be-tested printed circuit board can be made, is applied As the probe 13, a semi-rigid cable having an SMA connector mounted thereto may be applied.

As the to-be-tested printed circuit board 14, only passive components (resistors, inductors, capacitors or such) are mounted between a power line and a ground line of the to-be-tested printed circuit board 14, while, active components, i.e., devices which may act as noise sources, such as ICs, are not mounted. Instead of the active components, resistors are disposed between corresponding power supply and ground terminals, for example. Then when a noise visualization measurement apparatus 200 (see FIG. 17) is applied to measure for the to-be-tested printed circuit board 14, a desired frequency for a corresponding noise-simulating signal is set in the signal generator 11 simulating noise of a target device possibly acting as a noise generating source. Then, power supply and ground terminals of the probe 13 are connected by soldering to power supply and ground terminals for the target device on the to-be-tested printed circuit board 14. After that, in response to injection of the noise-simulating signal from the signal generator 11 to the to-be-tested printed circuit board 14 via the coaxial cable 12 and the probe 13, this signal flows from the place of the target device on the to-be-tested printed circuit board 14, and then flows through the power supply line and the ground line of the to-be-tested printed circuit board 14. This flow is detected as a flow of a radio frequency electric current (magnetic field) flowing through the power supply line and the ground line of the printed circuit board 14 by means of the noise visualization measurement apparatus 200. Therefrom, a problematic place if any can be determined from a noise spread state obtained from the flow of the eclectic current (magnetic field) through the substrate of the to-be-tested printed circuit board 14, measured by the measurement apparatus 200.

The second embodiment of the present invention is described next.

In the second embodiment, a connection configuration for the purpose of solving a problem concerning impedance matching for each of different frequencies is provided.

Figure 2:
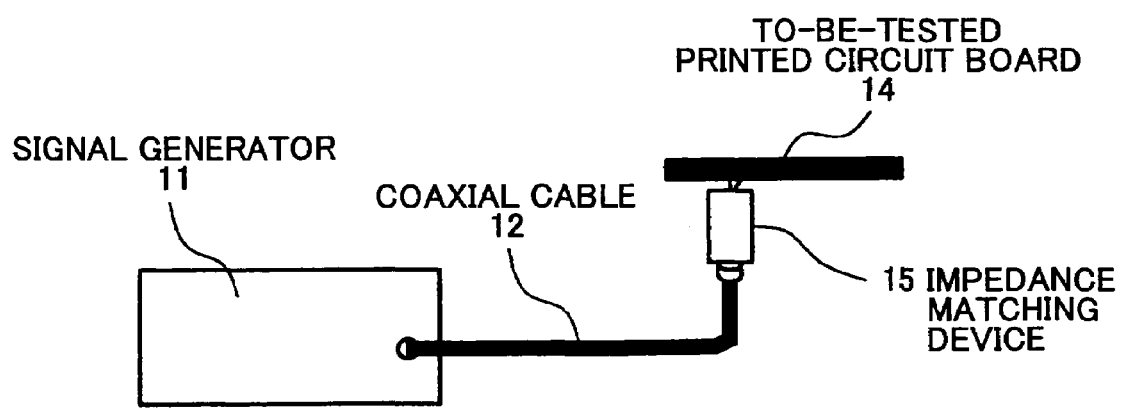
FIG. 2 generally shows a noise injecting method for a to-be-tested printed circuit board with a signal generator, a coaxial cable and an impedance matching device, according to a second embodiment of the present invention.

FIG. 2 shows a configuration of a noise injecting arrangement for injecting a noise-simulating signal to a to-be-tested printed circuit board 14 according to the second embodiment of the present invention.

In order to inject a noise-simulating signal for a desired target noise generating source (device), as described above for the first embodiment, the signal generator 11 simulating the noise generating source and the coaxial cable 12 are connected together. Then, the other end of the coaxial cable 12 is connected to the probe 13. Then, the respective signal and ground terminals of the probe 13 are soldered to the power supply and ground terminals on the to-be-tested printed circuit board 14 provided for the target device (noise generating source; IC or such). However, in the second embodiment, as shown in FIG. 2, different therefrom, an impedance matching device 15 is connected between the other end of the coaxial cable 12 instead of the probe 13. Then, respective signal and ground terminals of the impedance matching device 15 are soldered to the power supply and ground terminals on the to-be-tested printed circuit board 14 provided for the target device (IC).

Figure 3:
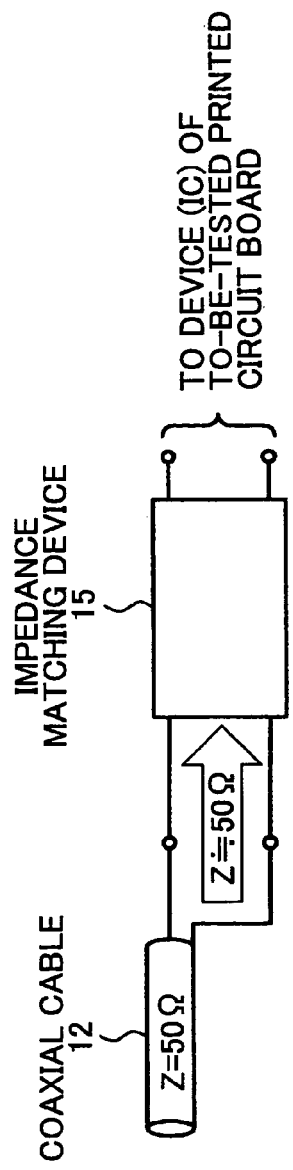
FIG. 3 shows the impedance matching device between a side of the signal generator and a side of the to-be-tested printed circuit board.

FIG. 3 illustrates impedance matching between a side of the signal generator 11 and a side of the to-be-tested printed circuit board 14 shown in FIG. 2.

Impedance of the signal generator 11 and the coaxial cable 12 is generally 50 Ω. On the other hand, impedance measured from the power supply and ground terminals on the to-be-tested printed circuit board 14 for the target device (IC) is very small. As a result, the noise-simulating signal may not be efficiently injected into the power supply and ground line on the to-be-tested printed circuit board 14, without such an impedance matching device. In the second embodiment of the present invention, the impedance matching device 15 is inserted between the coaxial cable 12 and the to-be-tested printed circuit board 14 as described above. The impedance matching device 15 is configured so that impedance for the coaxial cable 12 is set as 50 Ω, while impedance for the to-be-tested printed circuit board 14 is set to coincident with the impedance of the side of the to-be-tested printed circuit board 14. Thus, impedance matching between the side of the signal generator 11 and the side of the to-be-tested printed circuit board 14 is carried out.

Figure 4:
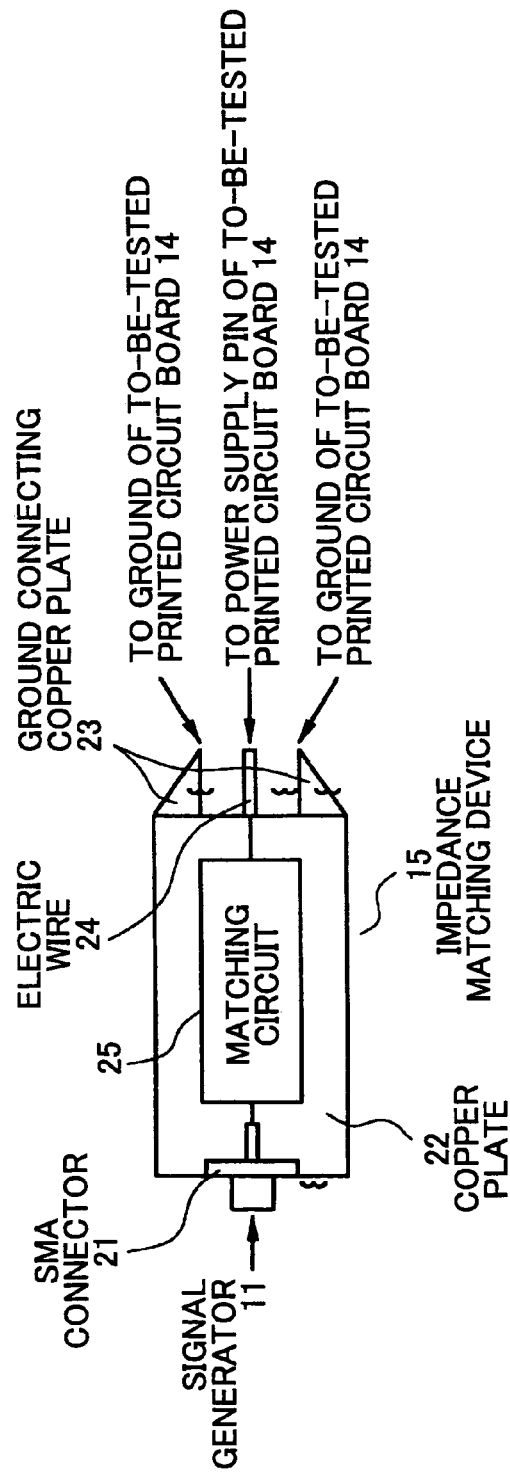
FIG. 4 generally shows a configuration of the impedance matching device.

FIG. 4 shows an example of a configuration of the impedance matching device 15 shown in FIGS. 2 and 3.

As shown in FIG. 4, an SMA connector 21 connecting between the coaxial cable 12 and the impedance matching device 15, a copper plate 22 for mounting respective components, ground-connecting copper plates 23 connecting between the impedance matching device 15 and a ground line of the to-be-tested printed circuit board 14, an electric wire 24 connecting between the impedance marching device 15 and the power supply line of the to-be-tested printed circuit board 14, and a matching circuit 25 configured for impedance matching between the side of the signal generator 11 and the side of the to-be-tested printed circuit board 14, are provided.

In this configuration, the SMA connector 21 is applied for connecting with the coaxial cable 12, the electric wire 24 is applied for connecting with the power supply terminal of the to-be-tested printed circuit board 14 provided for the target device (IC), and two copper plates 23 provided on both sides of the electric wire 24 are applied for connecting with the ground terminals on the to-be-tested printed circuit board 14 provided for the target device (IC).

Figure 5:
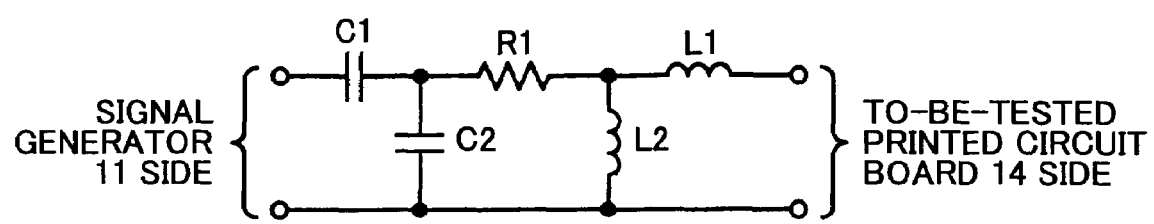
FIG. 5 shows a circuit diagram of the impedance matching device.

FIG. 5 shows a circuit diagram of the matching circuit 25 for a specific frequency applicable to the configuration described above with reference to FIGS. 2 through 4.

In the matching circuit 25, adjustment is made through measurement of a Smith chart by a network analyzer for a circuit including inductors and capacitors as well as corresponding constants.

As shown in FIG. 5, the matching circuit 25 includes inductors L1 and L2, capacitors C1 and C2 and a resistor R1. As shown, a signal terminal for the signal generator 11 is connected to one end of the capacitor C1, the other end thereof is connected to one end of the capacitor C2 and one end of the resistor R1. The other end of the resistor R1 is then connected to one end of the inductor L1, and one end of the inductor L2.

The respective other ends of the capacitor C2 and the inductor L2 are connected to the ground.

Since power supply line impedance of the to-be-tested printed circuit board 14 is very small, achieving the corresponding impedance matching device 15 only with capacitors and inductors may be difficult. By inserting the resistor R1 as mentioned above, impedance matching between the side of the signal generator 11 and the side of the to-be-tested printed circuit board 14 can be carried out.

When a noise visualization measurement apparatus 200 (see FIG. 17) is applied for measurement on another frequency, again adjustment is made through measurement of a Smith chart for the measurement frequency by the network analyzer for the matching circuit 25 including inductors and capacitors as well as corresponding constants in such a manner that impedance on the side of the coaxial cable 12 may be 50 Ω, the same as the above.

In the second embodiment, with the use of the impedance matching device 15, a noise-simulating signal can be efficiently injected into the power supply and ground terminals on the to-be-tested printed circuit board 14 for the target device (IC) for a desired frequency, in the circuit configuration shown in FIG. 2, when the to-be-tested printed circuit board 14 is measured with the use of the noise visualization measurement apparatus 200.

The third embodiment of the present invention will now be described.

In the third embodiment, in order to solve a problem that a measurement result may change depending on a positional relationship between a cable 12 and a to-be-tested printed circuit board 14 upon measurement with the use of the noise visualization measurement apparatus 200, due to radiation from the cable 12, a special jig 40 is applied for fixing the to-be-tested printed circuit board 14 and the probe 13.

Figure 6:
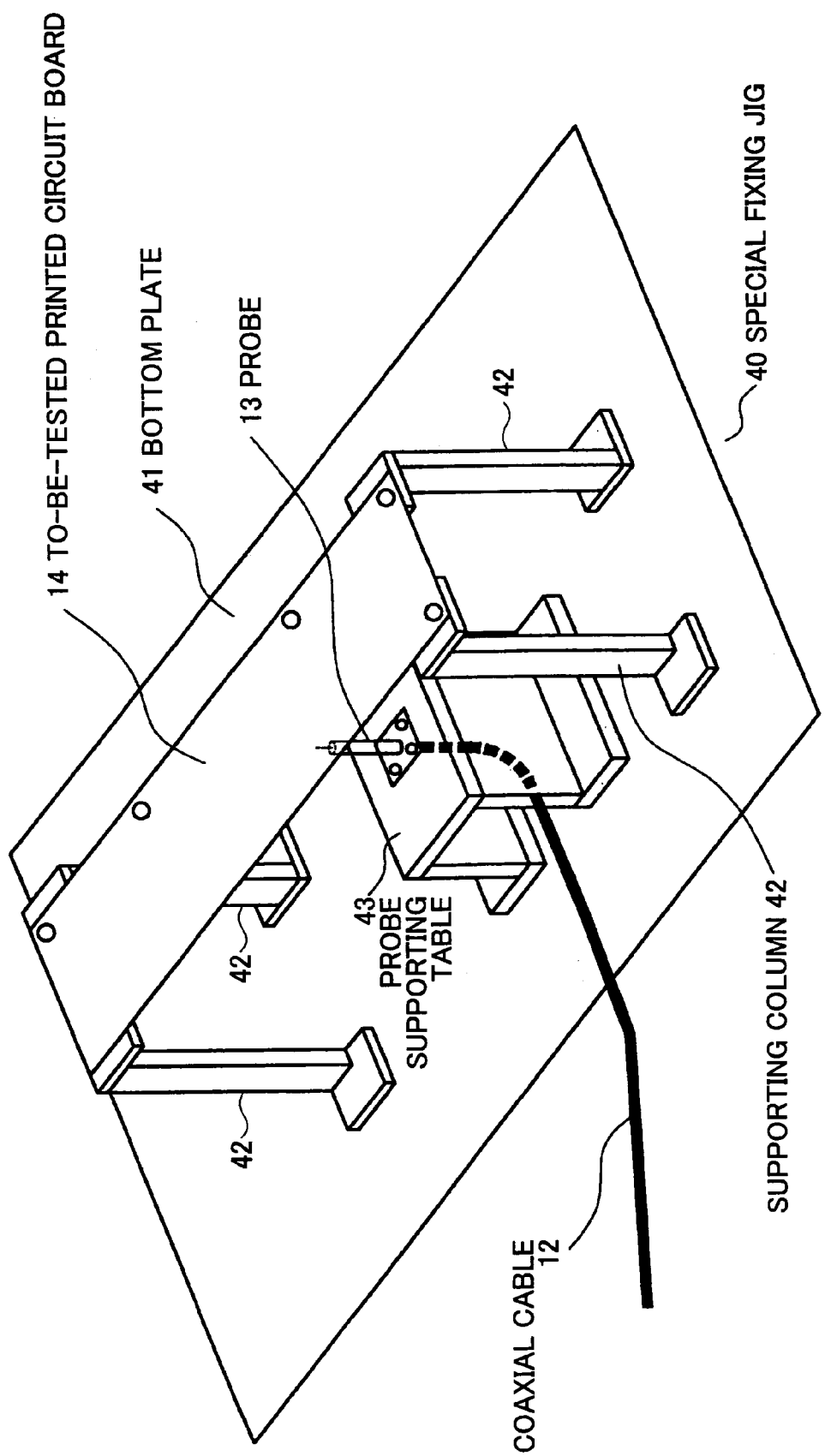
FIG. 6 shows a configuration of a special fixing jig for fixing the to-be-tested printed circuit board and the probe, according to a third embodiment of the present invention.

FIG. 6 shows a perspective view of the special fixing jig 40 for fixing the to-be-tested printed circuit board 14 according to the third embodiment of the present invention.

The special fixing jig 40 includes a bottom plate 41 for stably fixing supporting columns 42 and a probe supporting table 43, the supporting columns 42 for supporting the to-be-tested printed circuit board 14, and the probe supporting table 43 for supporting the SMA connector as the probe 13 in such a manner that the probe 13 may stand perpendicular to the measurement surface of the to-be-tested printed circuit board 14.

When the to-be-tested printed circuit board 14 is measured with the use of the noise visualization measurement apparatus 200, as described above for the first embodiment, a noise-simulating signal is set to have a predetermined frequency by the signal generator 11 as a noise generating source, and the power source terminal and the ground terminal of the probe 13 are soldered to the power source terminal and the ground terminal provided for the target device on the to-be-tested printed circuit board 14. In this occasion, the SMA connector as the probe 13 is screwed to the probe supporting table 43 in such a manner that the probe 13 may be perpendicular to the measurement surface of the to-be-tested printed circuit board 14. As a result, the coaxial cable 12 connected with the probe 13 can also be laid in such a manner that the coaxial cable 12 may be perpendicular to the measurement surface of the to-be-tested printed circuit board 14. That is, the coaxial cable 12 can be prevented from lying in parallel to the measurement surface of the to-be-tested printed circuit board 14, whereby electromagnetic interference otherwise occurring on the to-be-tested printed circuit board 14 from the coaxial cable 12 can be avoided.

Further, a reason why the to-be-tested printed circuit board 14 is supported by the four columns 42 as shown in FIG. 6 is that a distance between the measurement surface of the to-be-tested printed circuit board 14 and a sensor of the noise visualization measurement apparatus 200 is always-kept in a fixed amount. That is, the measurement surface of the to-be-tested printed board 14 can be prevented from inclining. The inclination of the measurement surface of the to-be-tested printed circuit board 14 may cause a change in the measurement result accordingly.

By thus applying the special fixing jig 40 for fixing the to-be-tested printed circuit board 14, a measurement result obtained from measurement of the to-be-tested printed circuit board 14 with the use of the noise visualization measurement apparatus 200 can be prevented from changing due to a positional relationship between the coaxial cable 12 and the substrate of the to-be-tested printed circuit board 14, and simultaneously, variation in the measurement result can be minimized accordingly.

The fourth embodiment of the present invention will now be described.

In the fourth embodiment, a small-sized oscillator is applied as the signal generator 11 for the purpose of solving a problem otherwise occurring due to radiation from the coaxial cable 12 due to standing waves occurring in the coaxial cable 12. Output of the small-sized oscillator is converted into a sinusoidal wave signal by means of a BPS (band pass filer), in a noise injecting arrangement.

Figure 7:
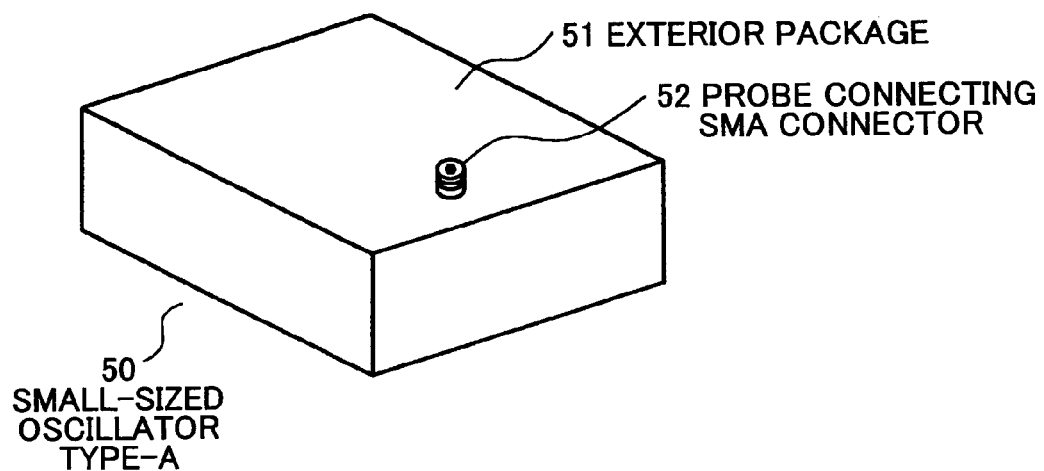
FIG. 7 shows an external perspective view of a small-sized oscillator Type-A, according to a fourth embodiment of the present invention.
Figure 8:
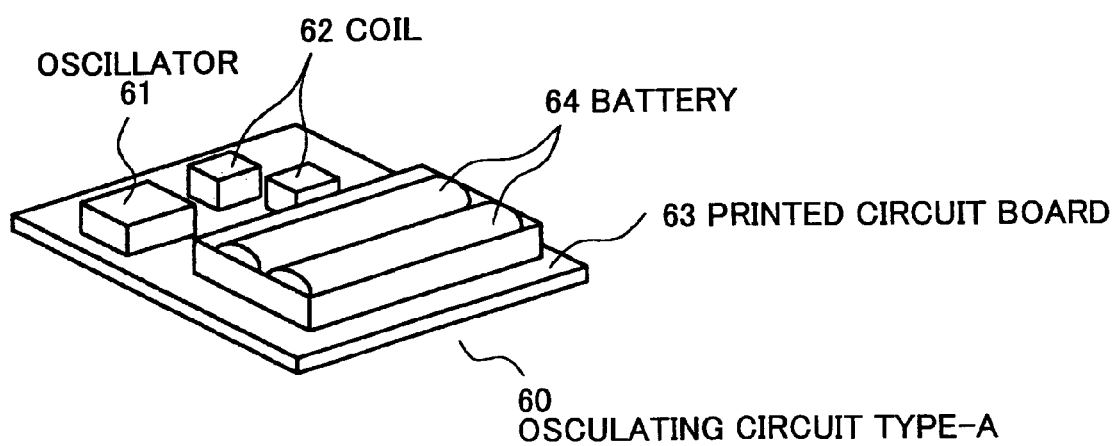
FIG. 8 shows a general internal configuration of the small-sized oscillator Type-A.
Figure 9:
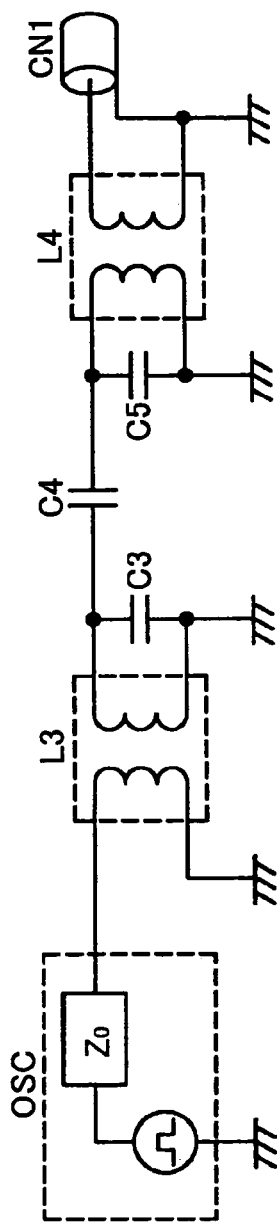
FIG. 9 shows a circuit diagram of the small-sized oscillator Type-A.

FIG. 7 shows an appearance of the small-sized oscillator Type-A 50; FIG. 8 shows an appearance of an oscillating circuit Type-A 60 included in the small-sized oscillator; and FIG. 9 shows a circuit diagram of the oscillating circuit shown in FIG. 8.

As shown in FIG. 7, the small-sized oscillator Type-A 50 includes an exterior package 51 made of a copper plate for preventing electromagnetic radiation from the small-sized oscillator itself; and a probe connecting SMA connector 52 for outputting a noise-simulating signal having a predetermined frequency generated by the oscillating circuit Type-A 60.

The exterior package 51 avoiding electromagnetic radiation from the small-sized oscillator is not limited to that of the copper plate, and any other member may be applied instead having a function of blocking electromagnetic waves such as that of an iron plate or such.

As shown in FIG. 8, the oscillating circuit Type-A 60 includes an oscillator 61 outputting a noise-simulating signal having a predetermined frequency; a coil 62 removing harmonic component (spurious) included in the output of the oscillator 61; a printed substrate 63 for mounting the components; and batteries 64 driving this circuit.

A copper tape is put on a remaining space on which no components are mounted on the printed substrate 63 for the purpose of stabilizing a ground level of the oscillating circuit Type-A 60 since a stable operation is required in the oscillating circuit Type-A 60 itself.

As shown in FIG. 9, the oscillating circuit Type-A 60 includes two stages of LC tuning circuits as a BPF. First, rectangular waves of the predetermined frequency are output from the oscillator OSC, and, from which, harmonic components (spurious) are removed by means of the tuning circuit made of an inductor L3 and a capacitor C3. Further, the thus-obtained signal is passed through a coupling capacitor C4, and then, further another inductor L4 and another capacitor C5 are applied for obtaining a frequency band width and an attenuation amount, whereby a noise-simulating signal only having the predetermined frequency is obtained. This noise-simulating signal is then output via the probe connecting SMA connector CN1 (52).

Figure 10:
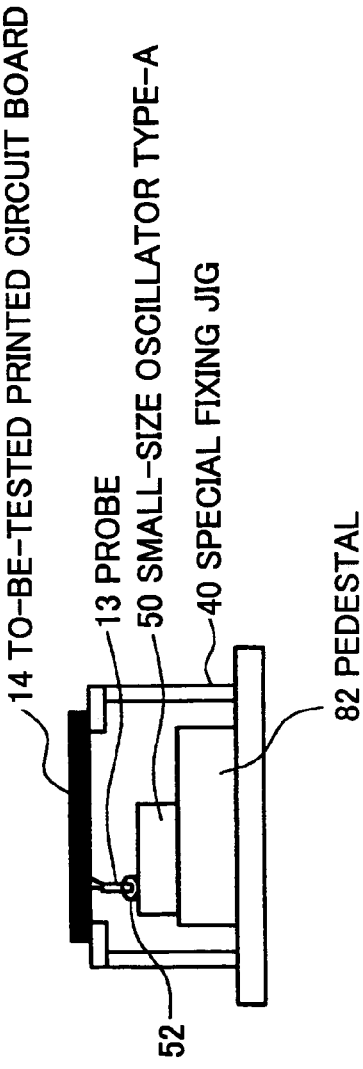
FIG. 10 shows a method for measuring of the to-be-tested printed circuit board by means of a noise visualization measurement apparatus with the use of the small-sized oscillator Type-A.

FIG. 10 shows an arrangement for measuring the to-be-tested printed circuit board 14 with the use of the noise visualization measurement apparatus 200 (see FIG. 17).

As shown in FIG. 10, the to-be-tested printed circuit board 14 is fixed on a special fixing jig 40, and the above-mentioned small-sized oscillator Type-A 50 is disposed on a pedestal 82 immediately below the to-be-tested printed circuit board 14. In a case where the small-sized oscillator Type-A 50 is further small, the small-sized oscillator Type-A 50 may be directly mounted on the to-be-tested printed circuit board 14 without applying the pedestal 82. As shown in FIG. 10, the probe connecting SMA connector 52 of the small-sized oscillator Type-A 50 is connected with a probe 13, while a signal terminal (for the noise-simulating signal) and a ground terminal of the probe 13 are connected to the power supply terminal and the ground terminal for the target device (IC) on the to-be-tested printed circuit board 14 by soldering. In this state, measurement is carried out with the use of the noise visualization measurement apparatus 200. As a result, a measurement result of the printed substrate of the to-be-tested printed circuit board 14 alone when the noise-simulating signal is injected to the power supply line and the ground line for the target device (IC) can be obtained without considering radiation from the coaxial cable 12.

The fifth embodiment of the present invention will now be described.

In the fifth embodiment, a small-sized oscillator is applied as the signal generator 11 for the purpose of solving a problem otherwise occurring due to radiation from the coaxial cable 12 due to standing waves occurring in the coaxial cable 12. In this case, output impedance of the small-sized oscillator is effectively reduced in a noise injecting arrangement.

Generally speaking, a power source impedance of a printed circuit board is small. Therefore, in order to obtain a measurement result approximating a form of an actual behavior with the use of the noise visualization measurement apparatus 200, output impedance of the oscillator should be lowered to approximate the output impedance of the target device (IC) when the output of the oscillator is coupled to the power supply terminal and the ground terminal for the target device (IC) on the to-be-tested printed circuit board.

FIG. 11 shows a general configuration of a low output impedance buffer circuit 101.

This buffer circuit 101 is disposed between the oscillator OSC and signal outputting electric wires 91. By configuring the buffer circuit 101 in such a manner that it has low output impedance, output impedance of the oscillator OSC can be lowered accordingly.

Specifically, this buffer circuit 101 may be made of parallel connection of inverters, as will be described below.

Figure 13:
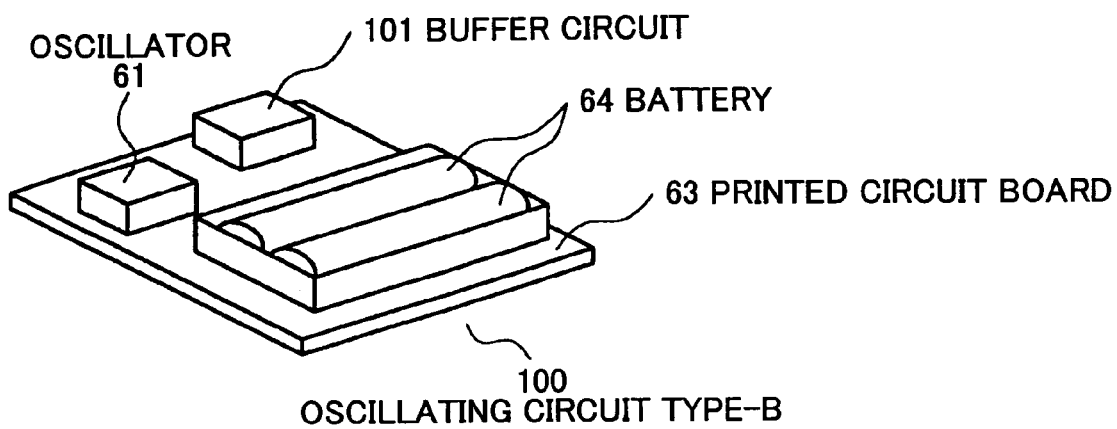
FIG. 13 shows a general internal configuration of the small-sized oscillator Type-B.
Figure 14:
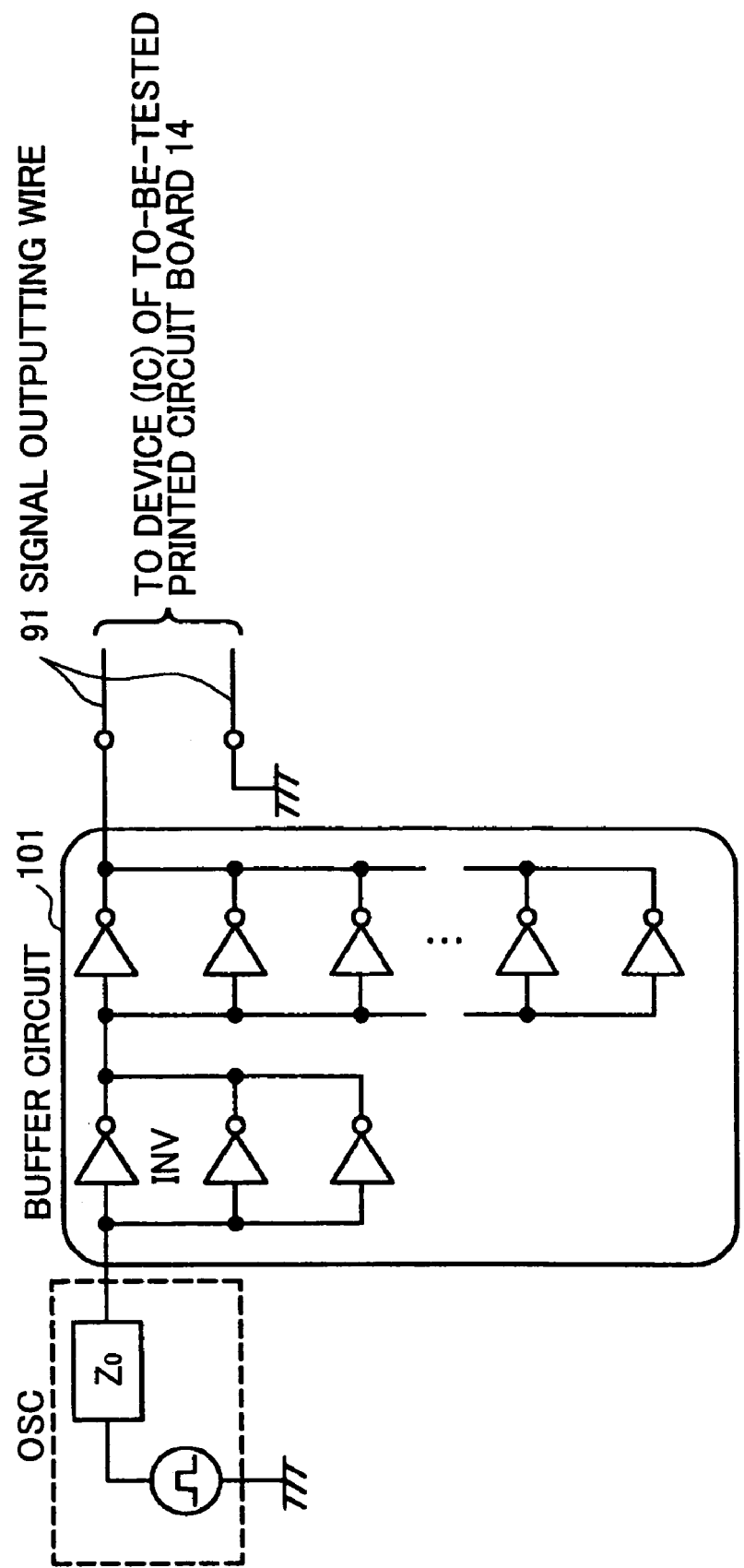
FIG. 14 shows a circuit diagram of the low-output-impdance3 buffer circuit employing inverters.

FIG. 12 shows a perspective external view of the small-sized oscillator Type-B 90; FIG. 13 shows an internal configuration of an oscillating circuit Type-B 100 included therein; and FIG. 14 shows a detailed configuration thereof.

As shown in FIG. 12, the small-sized oscillator Type-B 90 includes an exterior package 51 made of a copper plate for preventing electromagnetic radiation from the small-sized oscillator itself; and signal outputting electric wires 91 outputting a noise-simulating signal having a predetermined frequency generated by the oscillating circuit Type-B 100.

The exterior package 51 avoiding electromagnetic radiation from the small-sized oscillator is not limited to that of the copper plate, and, any other member may be applied instead having a function of blocking electromagnetic waves such as that of an iron plate or such.

As shown in FIG. 13, the oscillating circuit Type-B 100 includes an oscillator 61 outputting a noise-simulating signal having a predetermined frequency; the buffer circuit 101 made of the parallel connection of inverters; a printed substrate 63 for mounting the components; and batteries 64 driving this circuit. A copper tape is put on a remaining space on which no components are mounted on the printed substrate 63 for the purpose of stabilizing a ground level of the oscillating circuit Type-B 100 since a stable operation is required in the oscillating circuit Type-B 100 itself. As shown in FIG. 14, the oscillating circuit Type-B 100 includes inverters INV for improving a driving performance of the buffer circuit 101. First, rectangular waves of a predetermined frequency are output from the oscillator OSC, which are then passed through these inverters. Output of the inverters are input to the buffer circuit 101 made of the parallel connection of the inverters. After that, the thus-obtained signal is output via the signal outputting electric wires 91, which is a rectangular wave signal of the predetermined frequency.

The above-mentioned inverters INV for improving the driving performance are those considering fan-out. The inverters INV may be omitted when the parallel connection of the inverters of the buffer circuit 101 can be driven by the oscillator OSC without the inverters INV.

Since the buffer circuit 101 made of the parallel connection of the inverters is inserted, the output impedance of the buffer circuit 101 has a value obtained as a result of an impedance value of one inverter being divided by the number of the parallel connection. Since this impedance value is the output impedance of the oscillating circuit Type-B 100 accordingly, the reduced output impendence can be achieved. By adjusting the number of the parallel connection of the inverters included in the buffer circuit 101, the output impedance of the oscillating circuit Type-B 100 can be adjusted accordingly.

Figure 15:
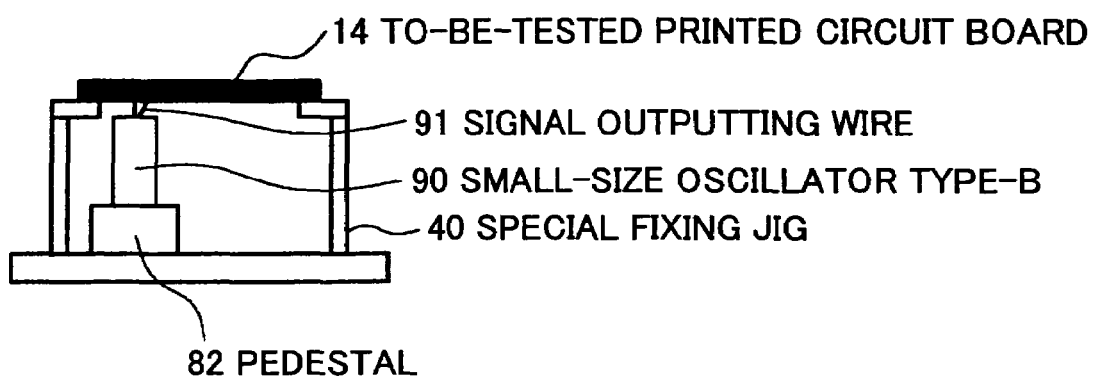
FIG. 15 shows a method for measuring of the to-be-tested printed circuit board by means of a noise visualization measurement apparatus with the use of the small-sized oscillator Type-B.

FIG. 15 shows an arrangement for measuring the to-be-tested printed circuit board 14 with the use of the noise visualization measurement apparatus 200.

As shown in FIG. 15, the to-be-tested printed circuit board 14 is fixed on a special fixing jig 40, and the above-mentioned small-sized oscillator Type-B 90 is disposed on a pedestal 82 immediately below the to-be-tested printed circuit board 14. In a case where the small-sized oscillator Type-B 90 is further small, the small-sized oscillator Type-B 90 may be directly mounted on the to-be-tested printed circuit board 14 without applying the pedestal 82.

As shown in FIG. 15, a signal terminal (for the noise-simulating signal) and a ground terminal of the signal outputting electric wires 91 are connected to the power supply line and the ground line for the target device (IC) on the to-be-tested printed circuit board 14 by soldering. In this state, measurement is carried out with the use of the noise visualization measurement apparatus 200. As a result, a measurement result of the printed substrate of the to-be-tested printed circuit board 14 alone when the noise-simulating signal is injected to the power source terminal and the ground terminal for the target device (IC) can be obtained, without considering radiation from the coaxial cable 12. Also, since the output impedance of the oscillator is made to have a value approximating the output impedance of the target device, the measurement result in a form approximating an actual behavior form can be achieved.

Further, the present invention is not limited to the above-described embodiments, and variations and modifications may be made without departing from the basic concept of the present invention claimed below.

The present application is based on Japanese Priority Applications No. 2005-022866, filed on Jan. 31, 2005, the entire contents of which are hereby incorporated herein by reference.

What is claimed is:

1. A testing method for measuring electromagnetic interference of noise on a to-be-tested printed circuit board, comprising:
a) injecting a signal simulating expected noise of a predetermined device mounted on the to-be-tested printed circuit board, into said to-be-tested printed circuit board, in a condition in which at least said predetermined device is not actually mounted on said to-be-tested printed circuit board; and
b) measuring electromagnetic interference of said signal, wherein:
in said injecting a), a noise injecting arrangement is applied to inject the signal simulating the expected noise to said to-be-tested printed circuit board, said noise injecting arrangement comprising:
a signal generator as a noise source;
a coaxial cable connected to an output of said signal generator;
an impedance matching device, connected to the other end of said coaxial cable, and transmitting a noise-simulating signal transmitted through the coaxial cable to a power supply line and a ground line of said to-be-tested printed circuit board for said predetermined device; and, wherein:
said impedance matching device comprises:
an SMA connector connecting between said coaxial cable and said impedance matching device;
a copper plate for mounting components thereon;
a ground connecting copper plate for connecting between said impedance matching device and a ground line of said to-be-tested printed circuit board;
an electric wire connecting between said impedance matching device and a power supply line of said to-be-tested printed circuit board; and
a matching circuit for matching impedance between said signal generator and said to-be-tested printed circuit board.

2. The testing method as claim in claim 1, wherein:
in said matching circuit,
a signal terminal of said signal generator is connected to one end of a first capacitor;
the other end of said first capacitor is connected to one end of a second capacitor and a resistor;
the other end of said resistor is connected to one end of a first inductor and one end of a second inductor; and
the other end of said second capacitor and the other end of said second inductor are connected to a ground line of said signal generator.

3. A testing method for measuring electromagnetic interference of noise on a to-be-tested printed circuit board, comprising:
a) injecting a signal simulating expected noise of a predetermined device mounted on the to-be-tested printed circuit board, into said to-be-tested printed circuit board, in a condition in which at least said predetermined device is not actually mounted on said to-be-tested printed circuit board; and
b) measuring electromagnetic interference of said signal, wherein:
in said injecting a), a noise injecting arrangement is applied to inject the signal simulating the expected noise to said to-be-tested printed circuit board, said noise injecting arrangement comprising:
supporting columns supporting the to-be-tested printed circuit board; and
a probe supporting table supporting an SMA connector of a probe in such a manner that said SMA connector may stand perpendicularly to a to-be-measured side of said to-be-tested printed circuit board, wherein:
said supporting columns and said probe supporting table are provided for the purpose of fixing positional relationship between a cable for injecting the noise-simulating signal to said to-be-tested printed circuit board and said to-be-tested printed circuit board, in consideration of an influence of radiation from said cable.

4. A testing method for measuring electromagnetic interference of noise on a to-be-tested printed circuit board, comprising:
a) injecting a signal simulating expected noise of a predetermined device mounted on the to-be-tested printed circuit board, into said to-be-tested printed circuit board, in a condition in which at least said predetermined device is not actually mounted on said to-be-tested printed circuit board; and
b) measuring electromagnetic interference of said signal, wherein:
in said injecting a), a noise injecting arrangement is applied to inject the signal simulating the expected noise to said to-be-tested printed circuit board, wherein:
in said noise injecting arrangement, a sinusoidal wave signal is obtained as an output signal of a small-sized oscillator via a BPF; and
said small-sized oscillator comprises:
an oscillating circuit outputting a signal of a predetermined frequency;
a coil removing a harmonic component of said signal;
a printed circuit board for mounting the components; and
a battery for driving the respective components.

5. The testing method as claimed in claim 4, wherein:
in said small-sized oscillator, as said BPF,
a first turning circuit comprising a first inductor and a first capacitor for receiving a rectangular-wave signal generated from said oscillating circuit for removing harmonic components from said rectangular-wave signal;
a second capacitor for coupling; and
a second turning circuit comprising a second inductor and a third capacitor for controlling a frequency band and an attenuation amount of the signal, for outputting a signal only having a predetermined frequency, to a probe connecting the SMA connector, are provided.

6. A testing method for measuring electromagnetic interference of noise on a to-be-tested printed circuit board, comprising:
a) injecting a signal simulating expected noise of a predetermined device mounted on the to-be-tested printed circuit board, into said to-be-tested printed circuit board, in a condition in which at least said predetermined device is not actually mounted on said to-be-tested printed circuit board; and
b) measuring electromagnetic interference of said signal, wherein:
in said injecting a), a noise injecting arrangement is applied to inject the signal simulating the expected noise to said to-be-tested printed circuit board, wherein:
in said noise injecting arrangement, for the purpose of invalidating standing waves of a coaxial cable, said to-be-tested printed circuit board is fixed on a predetermined fixing jig; and a small-sized oscillator for generating the noise-simulating signal is disposed on a pedestal immediately below said to-be-tested printed circuit board.

7. The testing method as claimed in claim 6, wherein:
said pedestal is omitted when said small-sized oscillator is so small that said pedestal is not required; and then,
said small-sized oscillator is directly mounted on said to-be-tested printed circuit board.

8. A testing method for measuring electromagnetic interference of noise on a to-be-tested printed circuit board, comprising:
  a) injecting a signal simulating expected noise of a predetermined device mounted on the to-be-tested printed circuit board, into said to-be-tested printed circuit board, in a condition in which at least said predetermined device is not actually mounted on said to-be-tested printed circuit board; and
  b) measuring electromagnetic interference of said signal, wherein:
in said injecting a), a noise injecting arrangement is applied to inject the signal simulating the expected noise to said to-be-tested printed circuit board, wherein:
in said noise injecting arrangement, for the purpose of invalidating standing waves of a coaxial cable, a small-size oscillator for generating the noise-simulating signal comprises:
an oscillating circuit outputting a signal of a predetermined frequency;
a buffer circuit comprising inverters connected in parallel;
a printed circuit board for mounting the component; and
a battery driving the respective components.

9. The testing method as claimed in claim 8, wherein:
said to-be-tested printed circuit board is fixed on a predetermined fixing jig; and
said small-sized oscillator is disposed on a pedestal immediately below said to-be-tested printed circuit board.

10. The testing method as claimed in claim 9, wherein:
said pedestal is omitted when said small-sized oscillator is so small that said table is not required; and then,
said small-sized oscillator is mounted on said to-be-tested printed circuit board, wherein:
said small-sized oscillator is directly soldered to a power supply line and a ground line of said to-be-tested printed circuit board, said power supply line and said ground line are those for said predetermined device.

* * * * *